United States Patent
Hung et al.

(10) Patent No.: US 8,743,638 B2
(45) Date of Patent: *Jun. 3, 2014

(54) METHOD AND CIRCUIT FOR TESTING A MULTI-CHIP PACKAGE

(75) Inventors: Chun-Hsiung Hung, Hsinchu (TW); Wen-Chiao Ho, Tainan (TW); Kuen-Long Chang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/564,189

(22) Filed: Aug. 1, 2012

(65) Prior Publication Data
US 2012/0300562 A1    Nov. 29, 2012

Related U.S. Application Data

(63) Continuation of application No. 12/190,715, filed on Aug. 13, 2008, now Pat. No. 8,259,521.

(60) Provisional application No. 61/056,460, filed on May 28, 2008.

(51) Int. Cl.
*G11C 7/00* (2006.01)

(52) U.S. Cl.
USPC .......... 365/201; 365/185.18; 365/189.09; 365/189.15; 365/200; 714/712; 714/715; 714/718; 714/720

(58) Field of Classification Search
USPC .......... 365/185.18, 189.09, 189.15, 200, 201; 714/712, 715, 718, 720
See application file for complete search history.

(56) References Cited

U.S. PATENT DOCUMENTS

| | | | |
|---|---|---|---|
| 4,942,556 A | 7/1990 | Sasaki et al. | |
| 6,233,182 B1 * | 5/2001 | Satou et al. | 365/200 |
| 6,877,118 B2 * | 4/2005 | Oshima et al. | 714/719 |
| 7,428,180 B2 | 9/2008 | Kim | |
| 2002/0082740 A1 | 6/2002 | Akram et al. | |
| 2005/0068818 A1 | 3/2005 | Sibata et al. | |
| 2006/0203563 A1 | 9/2006 | Guterman et al. | |
| 2006/0203567 A1 | 9/2006 | Poechmueller | |
| 2007/0140003 A1 | 6/2007 | Ido | |
| 2007/0168631 A1 | 7/2007 | Heo | |

\* cited by examiner

*Primary Examiner* — Thao H Bui
(74) *Attorney, Agent, or Firm* — McClure, Qualey & Rodack, LLP

(57) ABSTRACT

A method and circuit for testing a multi-chip package is provided. The multi-chip package includes at least a memory chip, and the memory chip includes a number of memory cells. The method includes performing a normal read operation on the memory cells to check if data read from the memory cells is the same with preset data in the memory cells; and performing a special read operation on the memory cells to check if data read from the memory cells is the same with an expected value, wherein the expected value is independent from data stored in the memory cells.

16 Claims, 2 Drawing Sheets

METHOD AND CIRCUIT FOR TESTING A MULTI-CHIP PACKAGE

This application is a continuation application of U.S. application Ser. No. 12/190,715, filed on Aug. 13, 2008, now U.S. Pat. No. 8,259,521, the contents of which are incorporated herein by reference. This application claims the benefit of U.S. provisional application Ser. No. 61/056,460, filed May 28, 2008, the subject matter of which is incorporated herein by reference.

BACKGROUND OF THE INVENTION

1. Field of the Invention

The invention relates in general to a method and circuit for operating a multi-chip package (MCP).

2. Description of the Related Art

Along with the multi-chip packaging technology develops, an integrated circuit (IC) provider, especially for mobile-phone applications, tends to incorporate several chips, including a known-good-die (KGD) Flash memory, a SRAM memory and a controller etc. provided by different suppliers, into a multi-chip package (MCP) so as to reduce the cost of IC products.

Normally, when a memory chip including several bare dies, is supplied to the IC provider, the die supplier will test all the bare dies to guarantee their good quality and reliability, such as at least 90% dies are good. Accordingly, the IC provider can package the known good-dies together with other IC chips. However, one trouble often confuses the die supplier: during the package process, if any damage happens to cause a failure to the whole package device, there is no way for the IC provider to know whether the memory chip produced by the die supplier or other chips have defects to cause a failure of the finished package. As a result, the IC provider has to deliver the whole package device to respective chip supplier to test which chip of the multi-chip package is damaged, thereby increasing complication of produce delivery. Therefore, there is a need to test the memory chip, which is easiest to be damaged, after the package is finished in order to guarantee the memory chip is good for the IC provider.

SUMMARY OF THE INVENTION

The invention is directed to a method and circuit for operating a multi-chip package. By respectively reading data preset in memory cells and reading data of each memory cell having an expected value independent from data preset in the memory cell, a memory chip incorporated in the multi-chip package can be easily tested to simplify the product delivery process.

According to a first aspect of the present invention, a method for testing a multi-chip package is provided. The multi-chip package includes at least a memory chip, and the memory chip includes a number of memory cells. The method includes performing a normal read operation on the memory cells to check if data read from the memory cells is the same with preset data in the memory cells; and performing a special read operation on the memory cells to check if data read from the memory cells is the same with an expected value, wherein the expected value is independent from data stored in the memory cells.

According to a second aspect of the present invention, a circuit for testing a multi-chip package is provided. The multi-chip package includes at least a memory chip, and the memory chip includes a number of memory cells. The circuit includes a normal-read logic circuit and a special-read logic circuit. The normal-read logic circuit is for performing a normal read operation on the memory cells to check if data read from the memory cells is the same with preset data in the memory cells. The special-read logic circuit is for performing a special read operation on the memory cells to check if data read from each of the memory cells is the same with an expected value, wherein the expected value is independent from data stored in the memory cells.

The invention will become apparent from the following detailed description of the preferred but non-limiting embodiments. The following description is made with reference to the accompanying drawings.

DETAILED DESCRIPTION OF THE INVENTION

The invention is directed to a method and circuit for testing a multi-chip package including a memory chip. After the multi-chip package is finished, a normal read operation and a special read operation are respectively performed on the memory chip to read data preset in memory cells and read data of the memory cells under a condition, such as zero word-line voltage. Therefore, whether the memory chip of the multi-chip package can be easily checked after the package is finished to simplify the product delivery process.

Figure 1:
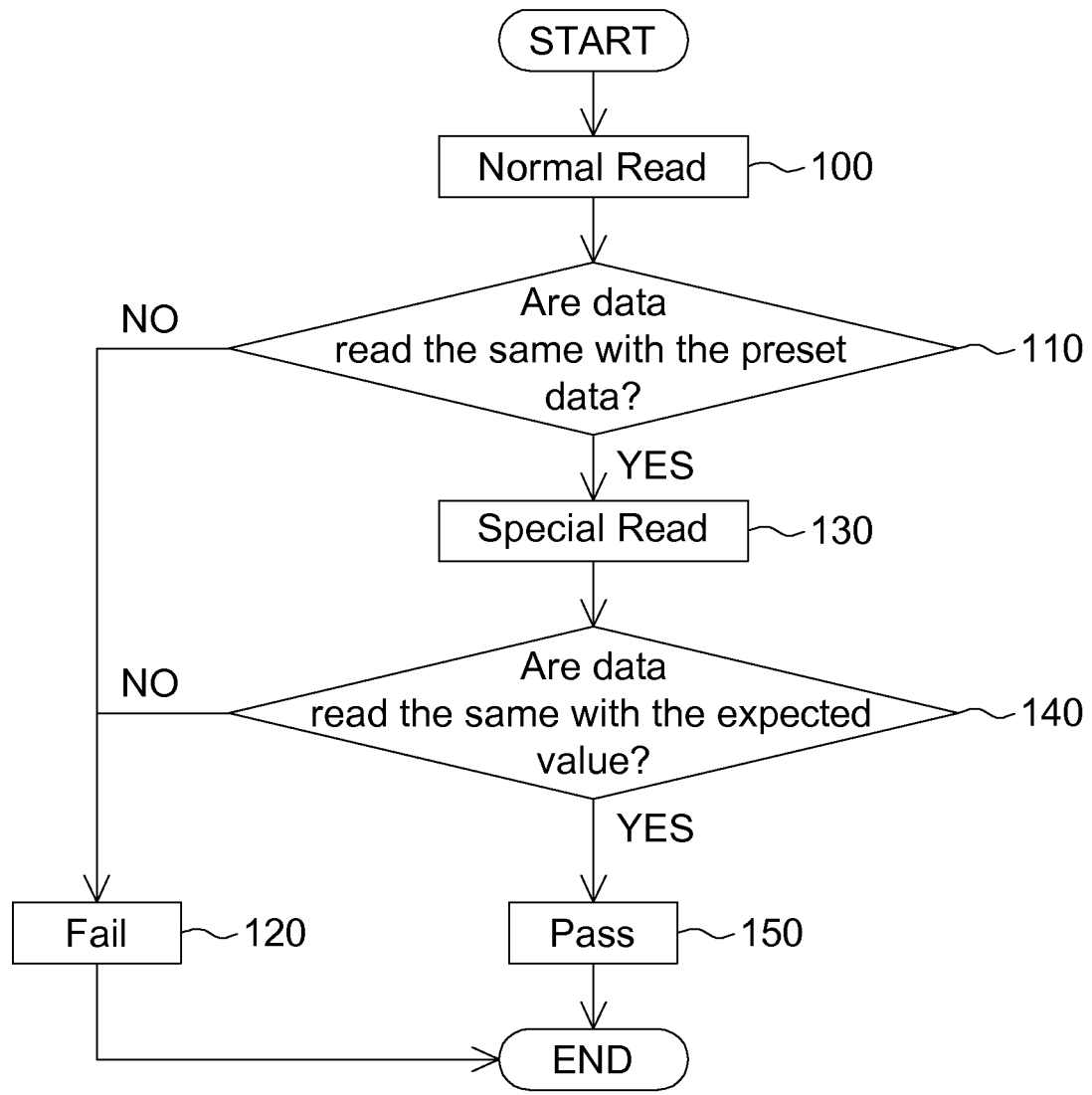
FIG. 1 is a flow chart of a method for testing a multi-chip package according to a preferred embodiment of the invention.

Referring to FIG. 1, a flow chart of a method for testing a multi-chip package according to a preferred embodiment of the invention is shown. The multi-chip package includes at least a memory chip, such as a KGD flash memory or a SRAM memory. The memory chip includes a number of memory cells and each cell stores one bit "1" or "0". First, in step 100, perform a normal read operation on the memory cells. For example, the portion of the memory cells to be used by a user on the memory chip are set to have data all "1", i.e. in a non-used state, and the portion of the memory cells not used by the user are programmed to a specific code, such as 010101 before the memory chip is supplied to the user (e.g. the IC provider).

Then, in step 110, check if data read from the memory cells in the normal read operation is the same with preset data in the memory cells. Take the portion of the memory cells to be used by the user for example. If the memory cells are set to be all "1", each memory cell has a low Vt status, and it is expected that each memory cell will have a cell current higher than a reference current, such as 15 mA, in the normal read operation under a normal word-line voltage, such as 5V. If not all the data read from the memory cells are the expected data "1", that is, at least one memory cell has a current lower than the reference current 15 mA, it means the at least one memory cell is in an open state (having an extremely high resistance), and the test process is determined to fail in the step 120.

Take the portion of the memory cells not to be used by the user for example. If the data read from the portion of the memory cells is not the same with the specific code programmed therein, the test process fails in the step 120.

If the data read from the memory cells in the normal read operation is the same with the expected data, e.g. all "1" or the specific code in the step 110, it does not mean the testing has passed since the data all "1" can be also obtained if a short state (having an extremely low resistance) of the memory cells happens, so it needs to proceed to the step 130 to perform a specific read operation on the memory cells, wherein the expected value read from the memory cells is independent from data preset in the memory cell. For example, all the word-lines of the memory cells are set to have a ground voltage 0V and the reference current is set to be a normal value e.g. 15 mA of the normal read operation. In this case, no matter each memory cell stores data "1" or data "0", it is expected that almost no current will flow by each memory cell and all "0" should be read from the memory cells in the special read operation under the normal reference current 15 mA.

In one embodiment, the word-lines of the memory cells can be set to have a very high voltage, such as 8V, which is higher than the normal word-line voltage, e.g. 5V (in the normal read operation) and the reference current is the normal value 15 mA. In this case, it is expected that a cell current of each memory cell will be higher than the reference current 15 mA and all "1" should be read from the memory cells in the special read operation.

In another embodiment, the reference current for comparing with the cell current can be set to be very low, 5 mA, which is lower than the cell currents, such as 10 mA~20 mA, of the memory cells in the normal read operation, and the word-line voltage is the normal value, e.g. 8V. In this case, it is expected that all "1" should be read from the memory cells in the special read operation since the currents flowing by the memory cells are all higher than the reference current, e.g. 5 mA.

In another embodiment, the reference current for comparing with the cell current can be set to be very high, such as 25 mA, which is higher than the cell currents, such as 10 mA~20 mA of the memory cells in the normal read operation, and the word-line voltage is the normal value 8V. In this case, it is expected that all "0" should be read from the memory cells in the special read operation since the currents flowing by the memory cells are all lower than the reference current, e.g. 25 mA.

Following that, in step 140, check if data read from the memory cells is the same with the expected values, e.g. all "1" or all "0". If the data read from the memory cells is the same with the expected values, the test process is determined to pass in the step 150, and if not all the data read from each memory cell is the same with the expected value, the test process is determined to fail in the step 120.

For example, in the special read operation when all the word-lines of the memory cells have the voltage 0V and the reference current is normal (15 mA), it is checked if the data read from the memory cells are all "0". If the data read are all "0", the memory chip passes the test and is guaranteed to be good. If the data read are not all "0", it means some memory cells are in a short state (having extremely low resistance), and the memory chip is determined to have defects.

In the special read when all the word-lines of the memory cells have a very high voltage, e.g. 8V, and the reference current is normal, it is checked if the data read from the memory cells are all "1". If the data read are all "1", the memory chip passes the test and is guaranteed to be good. If the data read are not all "1", it means some memory cells are in an open state, and the memory chip fails the test.

In the special read when the reference current for the memory cells is very low, e.g. 5 mA and the word-line voltage is normal (5V), it is checked if the data read from the memory cells are all "1". If the data read are all "1", the memory chip passes the test and is guaranteed to be good. If the data read are not all "1", it means some memory cells are in an open state, and the memory chip is determined to have defects.

In the special read when the reference current for the memory cells is very high, e.g. 25 mA and the word-line voltage is normal, it is checked if the data read from the memory cells are all "0". If the data read are all "0", the memory chip passes the test and is guaranteed to be good. If the data read are not all "0", it means some memory cells are in a short state, and the memory chip fails the test.

As mentioned above, by performing normal and special read operations on the memory cells, the memory chip incorporated in the multi-chip package can be easily tested to be good or have defects, thereby simplifying the product delivery process.

Figure 2:
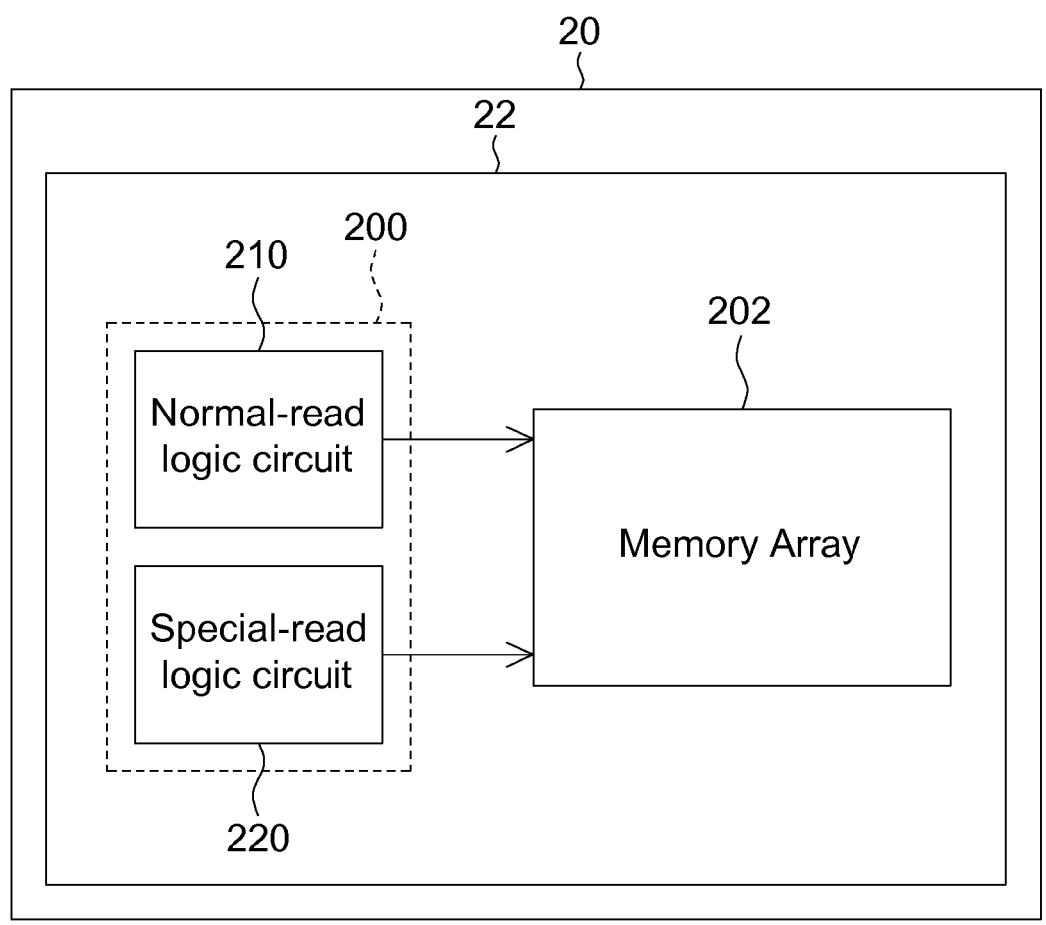
FIG. 2 is a block diagram of a circuit for testing a multi-chip package according to the preferred embodiment of the invention.

The invention is further directed to a circuit for testing a multi-chip package. As shown in FIG. 2, the multi-chip package 20 includes at least a memory chip 22, such as the KGD flash memory or the SRAM memory. The memory chip 22 includes a memory array 202 having a number of memory cells (not shown). The test circuit 200 includes a normal-read logic circuit 210 and a special-read logic circuit 220, which are both disposed on the memory chip 22. The normal-read logic circuit 210 is for performing a normal read operation on the memory cells of the memory array 202 to check if data read from the memory cells is the same with preset data in the memory cells. The special-read logic circuit 220 is for performing a special read operation on the memory cells of the memory array 202 to check if data read from the memory cells are the same with an expected value, wherein the expected value is independent from the data preset in the memory cells.

Although the normal read operation is exemplified to read the preset data (all "1" or the specific code) in the memory cells and the specific read operation is exemplified to read the expected values (all "1" or all "0") in the memory cells under a specific condition of word-line voltage and reference current for the memory cells, the invention is not limited thereto. As long as two different kinds of read operations are performed to check the memory-chip damage conditions, such as short cells and open cells, any alternative will not depart from the scope of the invention.

The method and circuit for testing a multi-chip package disclosed by the embodiment of the invention have the following advantage. Owing that the memory chip is easiest to be damaged in the packaging process of the multi-chip package, by using two different kinds of read operations to test the damage (including short cells and open cells) of the memory chip, the provider of the multi-chip package can easily determine whether the memory chip is damaged or not to greatly simplify the whole product delivery process.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for operating a memory chip, the memory chip comprising a plurality of memory cells, the method comprising:

performing a special read operation on the memory cells, comprising:

applying a word-line voltage to a plurality of word lines of the memory cells and using a reference current;

wherein the word-line voltage or the reference current is higher or lower than that in a normal read operation on the memory cells such that an expected value independent from values of data stored in the memory cells is obtained for the memory cells without defects.

2. The method according to claim 1, wherein the memory chip further comprises a number of the memory cells not for user use and programmed by a specific code, and the method further comprises a step of performing the normal read operation on the number of non-user-used memory cells and checking if data read from the non-user-used memory cells is the same as the specific code.

3. The method according to claim 1, further comprises a step of performing the normal read operation on a number of the memory cells for user use and programmed by preset data and checking if data read from the user-used memory cells is the same as the preset data.

4. The method according to claim 3, wherein the preset data in the memory cells used by the user are all "1" in the normal read operation.

5. The method according to claim 1, wherein in the step of performing the special read operation on the memory cells, the word-line voltage at a voltage of 0V is applied to a plurality of word lines of the memory cells and a normal reference current is used as the reference current.

6. The method according to claim 1, wherein in the step of performing the special read operation on the memory cells, the word-line voltage at a very high voltage is applied to the word lines of the memory cells and a normal reference current is used as the reference current, wherein the very high voltage is higher than a voltage applied to the word lines of the memory cells in the normal read operation.

7. The method according to claim 1, wherein in the step of performing the special read operation on the memory cells, a very low reference current is used as the reference current to compare with a cell current flowing by each of the memory cells and a normal word-line voltage is applied as the word-line voltage, wherein the very low reference current is lower than a cell current flowing by each of the memory cells in the normal read operation.

8. The method according to claim 1, wherein in the step of performing the special read operation on the memory cells, a very high reference current is used as the reference current to compare with a cell current flowing by each of the memory cells and a normal word-line voltage is applied as the word-line voltage, wherein the very high reference current is higher than a cell current flowing by each of the memory cells in the normal read operation.

9. The method according to claim 1, wherein the normal read operation is performed on the memory cells so as to check if data read from the memory chip is the same as preset data in the memory cells.

10. The method according to claim 1, wherein the special read operation is performed on the memory cells to check if data read from the memory chip is the same as the expected value.

11. A method of operating a memory chip, the memory chip comprising a plurality of memory cells, the method comprising the steps of:
performing a special read operation on the memory cells, comprising:
applying a bias condition to the memory cells;
wherein the bias condition includes a parameter which is higher or lower than that in a normal read operation on the memory cells such that an expected value independent from values of data stored in the memory cells is obtained for the memory cells without defects.

12. A circuit for operating a memory array in a memory chip, the memory array comprising a plurality of memory cells, the circuit comprising:
a normal-read logic circuit, for performing a normal read operation on the memory cells; and
a special-read logic circuit, for performing a special read operation on the memory cells, the special read operation applying a bias condition to the memory cells, wherein the bias condition includes a parameter which is higher or lower than that in the normal read operation such that an expected value independent from values of data stored in the memory cells is obtained for the memory cells without defects.

13. The circuit according to claim 12, wherein the normal-read logic circuit performs the normal read operation on the memory cells so as to check if data read from the memory chip is the same as the data in the memory cells.

14. The circuit according to claim 12, wherein the special-read logic circuit performs the special read operation on the memory cells to check if data read from the memory chip is the same as the expected value.

15. The circuit according to claim 14, wherein the parameter is a word-line voltage or a reference current.

16. The circuit according to claim 12, wherein the parameter is a word-line voltage or a reference current.

* * * * *